US007037635B2

(12) United States Patent
Sawada et al.

(10) Patent No.: US 7,037,635 B2

(45) Date of Patent: May 2, 2006

(54) PRESENSITIZED PLATE

(75) Inventors: Hirokazu Sawada, Shizuoka (JP); Akio Uesugi, Shizuoka (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

(21) Appl. No.: 10/059,378

(22) Filed: Jan. 31, 2002

(65) Prior Publication Data

US 2002/0155377 A1 Oct. 24, 2002

(30) Foreign Application Priority Data

Feb. 9, 2001 (JP) ............................ 2001-033358
Sep. 28, 2001 (JP) ............................ 2001-304521

(51) Int. Cl.
*G03F 7/09* (2006.01)

(52) U.S. Cl. .............................. 430/270.1; 430/271.1; 430/275.1; 430/278.1; 101/453; 101/454

(58) Field of Classification Search ............ 430/270.1, 430/271.1, 278.1, 275.1; 101/453, 454; 437/437–440
See application file for complete search history.

(56) References Cited

U.S. PATENT DOCUMENTS 4,715,903 A 12/1987 Asten et al.
4,861,396 A 8/1989 Matsuo et al.
5,114,825 A * 5/1992 Takizawa et al. ........... 430/159
6,447,982 B1 * 9/2002 von Asten et al. ....... 430/278.1
6,572,715 B1 * 6/2003 Komine et al. ............ 148/437
6,764,587 B1 * 7/2004 Sawada et al. ............ 205/214
2001/0041305 A1 * 11/2001 Sawada et al. .......... 430/278.1
2002/0160308 A1 * 10/2002 Nishino et al. .......... 430/271.1
2003/0124364 A1 * 7/2003 Sawada et al. .......... 428/472.2

FOREIGN PATENT DOCUMENTS

| | | | |
|---|---|---|---|
| EP | 0 887 430 | A1 | 12/1998 |
| EP | 0 942 071 | A1 | 9/1999 |
| EP | 1 293 579 | A2 * | 3/2003 |
| JP | 05-462 | B | 9/1986 |
| JP | 03-11635 | B | 2/1991 |
| JP | 04-73392 | B | 11/1992 |
| JP | 07-039906 | A | 2/1995 |
| JP | 07-126820 | A | 5/1995 |
| JP | 2000-037964 | A | 2/2000 |

* cited by examiner

*Primary Examiner*—Barbara L. Gilliam
(74) *Attorney, Agent, or Firm*—Buchanan Ingersoll PC

(57) ABSTRACT

The present invention provides a presensitized plate, comprising: an aluminum plate having an aluminum purity of not less than 99 wt %; and a photosensitive layer formed on the surface of said aluminum plate, wherein a fatigue fracture strength of the presensitized plate after a heat treatment at 300° C. for 7 minutes is not less than 75% of the fatigue fracture strength thereof before the heat treatment. The presensitized plate is excellent in efficiency and stability of a roughening treatment, and is capable of preventing generation of fatigue fracture of the lithographic printing plate during printing even if a burning treatment has been made on lithographic printing plate.

6 Claims, 1 Drawing Sheet

PRESENSITIZED PLATE

BACKGROUND OF THE INVENTION

1. Field of the Invention

The present invention relates to a presensitized plate, and particularly, to a presensitized plate which is excellent in thermosoftening resistance, and especially, in fatigue strength after burning treatment so that generation of cracking can be effectively prevented. Further, the present invention relates to a presensitized plate, which is capable of strongly adhering to a recording layer and excellent in press life.

2. Description of the Related Art

An aluminum plate has been heretofore employed as a support of a lithographic printing plate. In this case, a roughening treatment is generally performed on a surface of the aluminum plate in order to provide it with adhesivity to a photosensitive layer and with water-holding property at the non-image area thereof. As for a method of a surface-roughening treatment, there are known several methods such as a mechanical roughening method such as ball graining, brush graining; an electrochemical roughening method wherein the surface of the aluminum plate is electrolytically polished by use of an electrolyte mainly composed of hydrochloric acid, nitric acid, etc.; and a chemical roughening method wherein the surface of the aluminum plate is etched by use of an acid solution or an alkali solution. However, since a roughened surface obtained by means of the electrochemical roughening method is homogeneous in pits (roughness) and excellent in printing performance as the aluminum plate is formed into a lithographic printing plate, the roughening treatment is mainly performed in recent years by means of the electrochemical roughening method or by a combination of the electrochemical roughening method and another kind of roughening method.

As for the materials suitable for use in such roughening treatment, JIS A1000 type materials represented by a JIS A1050 material are frequently employed. The reason for this is that since the A1000 type materials are high in purity of aluminum and hence negligible in impurities, an electrochemical roughening treatment (electrolytic roughening treatment) or a chemical roughening treatment can be stably performed. Additionally, the A1000 type materials are also suitably applicable to the mechanical roughening treatment because of a proper mechanical strength.

Following the roughening treatment, the aluminum plate is generally subjected to an anodizing treatment in order to improve a hardness of the surface thereof and to improve the adhesion between the aluminum plate and a photosensitive layer. Subsequently, the photosensitive layer is formed on the aluminum plate to thereby obtain a presensitized plate. As required, an interface treatment or an undercoating is also generally performed prior to the formation of the photosensitive layer. The presensitized plate thus obtained is then subjected to an exposure and a development of an image, and additionally subjected to gumming if required, thereby forming a lithographic printing plate, which is then attached to a plate cylinder of a printing machine to perform printing.

When the lithographic printing plate is attached to the plate cylinder of the printing machine, both end portions of the lithographic printing plate are bent, and these bent end portions are respectively fixed to two clamps, i.e. so-called a holding portion and a holding tail portion of the plate cylinder of the printing machine in such a manner that tension is applied to the lithographic printing plate so as to enable the lithographic printing plate to be closely adhered to the plate cylinder. In the case of offset printing, when ink and fountain solution are fed to the lithographic printing plate fixed to the plate cylinder, the ink is adhered to an image area exhibiting lipophilicity while the fountain solution is adhered to a non-image area exhibiting hydrophilicity, thereby permitting the ink to be selectively disposed in correspondence with the image. The ink corresponding with the image is once transferred to an intermediate cylinder called a blanket cylinder, and then, re-transferred to paper, etc., thus obtaining a printed matter. In this case, the two bent portions formed at both ends of the lithographic printing plate are likely to be relieved up from the plate cylinder due to a reaction force to the bending of the lithographic printing plate. Accordingly, there is a problem if the plate cylinder is repeatedly pressed against the blanket cylinder under such a condition, the aforementioned relieved portion is bent repeatedly, thus inviting generation of fatigue fracture of the lithographic printing plate.

Meanwhile, the lithographic printing plate is generally subjected to a heat treatment called a burning treatment (post baking treatment) after the exposure and the development. Such burning treatment is generally performed at a temperature of 200° C. or more, in particularly at a temperature ranging from 240° C. to 270° C. though the specific temperature thereof differs depending on a purpose thereof. The photosensitive layer of the image area is further hardened by the burning treatment, thereby making it possible to improve the press life and hence to increase the number of sheets, which is attributed to the fact that since the photosensitive layer of the image area is hardened, abrasion of the photosensitive layer during the printing is suppressed.

However, in some cases, there occurs a problem that the recrystallization and restoration in the aluminum plate are caused to occur by the burning treatment, thereby lowering the mechanical strength of the aluminum plate.

There are a number of suggestions with respect to the lowering of mechanical strength after the burning treatment. For example, JP 04-73394 B and JP 07-126820 A suggest defining 0.2% proof stress or the like after the heat treatment. Further, JP 07-39906 A suggests defining a circle-corresponding diameter of a crystal grain in a cross-section of a plate. Moreover, JP 07-305133 A suggests defining the quantity of the solid solution of Fe.

There are a number of suggestions of countermeasures with respect to components of an alloy. For example, a method of adding Mn is suggested in JP 05-501585 A; U.S. Pat. No. 5,009,722 B; JP 04-19290 B; and U.S. Pat. No. 5,114,825 B. Further, a method of adding Mg is suggested in: JP 05-00462 B; JP 06-37116 B; JP 04-73392 B; JP 03-68939 B; and JP 03-11635 B. Further, a method of adding both Mn and Mg is suggested in JP 05-76530 B and JP 05-28197 B. Further, a method of adding Zr singly or in combination with Mn or Mg is suggested in JP 1992-72720 B.

According to the method of defining the 0.2% proof stress after the heat treatment as suggested by JP 04-73394 B and JP 07-126820 A, according to the method of defining the circle-corresponding diameter of a crystal grain in a cross-section of a plate as suggested by JP 07-39906 A, or according to the method of defining the quantity of the solid solution of Fe as suggested by JP 07-305133 A, it is certainly possible to minimize a lowering rate of the tensile strength after the burning treatment, and these methods are effective to some extent. However, these methods are accompanied with a problem that as a result of the repetition of printing of a large number of sheets, the fatigue fracture of the lithographic printing plate can be caused to occur.

On the other hand, although the methods of adding Mn or Mg are effective in preventing the fracture of the lithographic printing plate during the printing, but are accompanied with problems that the methods are inferior in terms of the efficiency and the stability of the roughening treatment as compared with the JIS A1000 type materials, which are excellent in applicability to the roughening treatment, and also invite increase in cost for the raw materials as the methods require predetermined trace elements as raw materials.

SUMMARY OF THE INVENTION

The present invention has been made in view of such circumstances, and an object of the present invention is to provide a presensitized plate, which is excellent in efficiency and stability of a roughening treatment, and is capable of preventing generation of fatigue fracture of the lithographic printing plate during printing even if a burning treatment has been made on the lithographic printing plate. Another object of the present invention is to provide a presensitized plate, which is very strong in adhesive force between a support for lithographic printing plate and a recording layer, and is also very excellent in press life so that the peeling or partial missing of an image area can be substantially prevented.

As a result of intensive studies made by the present inventors, it has been found out that the above objects can be achieved by employing as a raw material an aluminum plate having an aluminum purity of 99 wt % or more and by defining a rate of change in fatigue fracture strength before and after the heat treatment at 300° C. for 7 minutes, thus accomplishing the present invention.

Namely, the present invention provides a presensitized plate including an aluminum plate having an aluminum purity of not less than 99 wt %, and a photosensitive layer formed on the surface of the aluminum plate. In the presensitized plate, a fatigue fracture strength after a heat treatment at 300° C. for 7 minutes is not less than 75% of that before the heat treatment.

Preferably, in the presensitized plate of the present invention, a 0.2% proof stress after the heat treatment at 300° C. for 7 minutes is 65% or more of that before the heat treatment.

Further, the present invention provides a presensitized plate including an aluminum plate having an aluminum purity of not less than 99 wt %, and a photosensitive layer formed on the surface of the aluminum plate. In the presensitized plate, crystal grains located within a region ranging from the surface of the aluminum plate to a depth of 50 μm has an average width of not more than 80 μm and a maximum width of not more than 150 μm in a direction perpendicular to a rolling direction of said aluminum plate, and has an average length of not more than 400 μm and a maximum length of not more than 500 μm in a rolling direction of the aluminum plate. In particular, the present invention provides, as a preferable aspect of the invention, a presensitized plate including an aluminum plate having an aluminum purity of not less than 99 wt % and a photosensitive layer formed on the surface of the aluminum plate, in which the crystal grains located within the region ranging from the surface of the aluminum plate to a depth of 50 μm has an average width of not more than 80 μm and a maximum width of not more than 150 μm in a direction perpendicular to a rolling direction of said aluminum plate, and has an average length of not more than 400 μm and a maximum length of not more than 500 μm in a rolling direction of the aluminum plate. Furthermore, in the presensitized plate, the fatigue fracture strength after a heat treatment at 300° C. for 7 minutes is not less than 75% of that before the heat treatment.

According to a preferable aspect of the present invention, the aluminum plate contains 0.15–0.5 wt % of Fe; 0.03–0.15 wt % of Si; and 0.003–0.050 wt % of Ti; and further contains 0.001–0.05 wt % of Cu and/or 0.001–0.1 wt % of Mg.

The presensitized plate of the present invention is preferably obtained by performing roughening treatment and an anodizing treatment for the surface of the aluminum plate prior to the formation of the photosensitive layer.

Preferably, the presensitized plate of the present invention is obtained by forming concave pits having an average opening diameter of not more than 0.6 μm and an average ratio of the depth of the concave pit to the opening diameter thereof (pit depth/pit diameter) ranging from 0.15 to 1.0 on the surface of the aluminum plate prior to the formation of the photosensitive layer. In this case, the average opening diameter of the concave pits should more preferably be not more than 0.3 μm and not less than 0.02 μm.

The average value of the pit depth/opening diameter ratio should more preferably be not less than 0.2 and not more than 0.5.

DETAILED DESCRIPTION OF THE INVENTION

Figure 1:
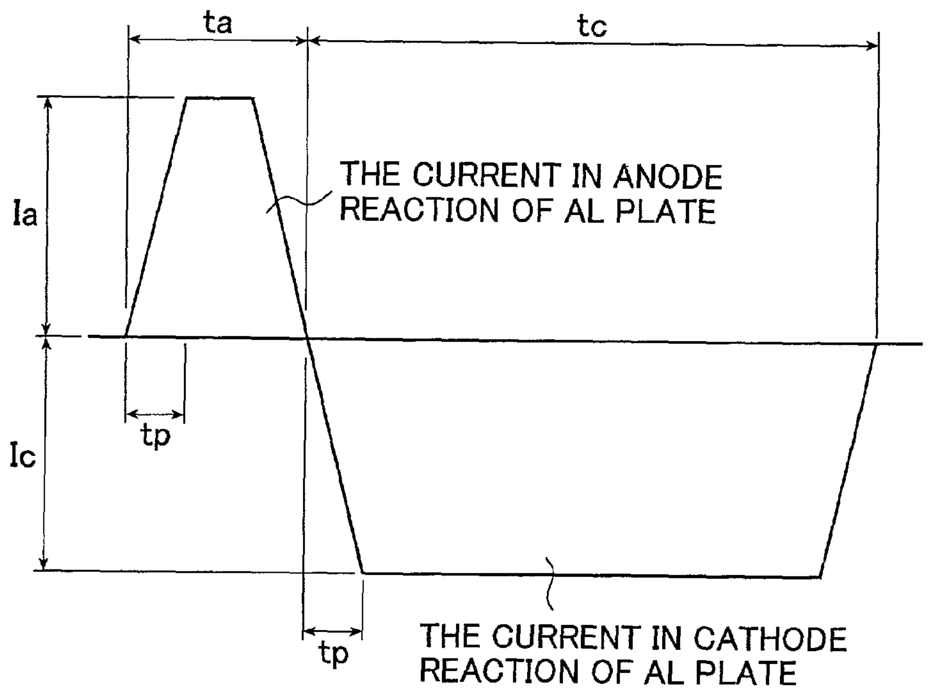
FIG. 1 is a diagram illustrating one example of a trapezoidal waveform of an AC power source preferably employed in an electrochemical roughening treatment according to the present invention.

Next, the present invention will be explained in detail.

There is no particular limitation with respect to an aluminum plate to be employed in a presensitized plate of the present invention as long as an aluminum purity thereof is 99 wt % or more and may contain Fe, Si, Ti, Cu, Mg, etc. in addition to Al. Among them, the aluminum plate should preferably contain 0.15–0.5 wt % of Fe; 0.03–0.15 wt % of Si; and 0.003–0.050 wt % of Ti; and further contain 0.001–0.05 wt % of Cu and/or 0.001–0.1 wt % of Mg.

Fe has an influence on the strength of the lithographic printing plate and on the fitness of the lithographic printing plate for attachment on a plate cylinder. The content of Fe is preferably not more than 0.5 wt %, more preferably not more than 0.4 wt %. Further, Fe is contained as an unavoidable impurity in an aluminum ground metal as a raw material, so that if the content of Fe is less than 0.15 wt %, a high-purity ground metal which is very expensive is required to be employed, which is unrealistic. In this regard, preferably, the content of Fe is not less than 0.15 wt %, more preferably not less than 0.2 wt %.

Since Si is contained as an unavoidable impurity in an Al ground metal as a raw material, so that a minute amount of Si is often intentionally added to the raw material in order to prevent the non-uniformity of the contents of Si depending on the raw materials. In this case, if the content of Si exceeds over 0.15 wt %, the problem that the non-image area is more likely to be stained would be caused to occur. In this regard, the content of Si should preferably be not more than 0.15 wt %, more preferably not more than 0.13 wt %. Meanwhile, depending on the raw materials, the content of Si would already be not less than 0.03 wt %, so that the content of Si less than 0.03 wt % would be unrealistic. In this regard, the content of Si should preferably be not less than 0.03 wt %, more preferably not less than 0.05 wt %.

Ti is added in order to fine a crystal structure of the aluminum plate on the occasion of casting the aluminum plate as heretofore. If the content of Ti is less than 0.003 wt %, the effect of fining the crystal structure of the aluminum plate would become insufficient. In this regard, the content of Ti should preferably be not less than 0.003 wt %, more preferably not less than 0.005 wt %. On the other hand, if the content of Ti is more than 0.050 wt %, it would be impossible to expect any further improvement on the effect of fining the crystal structure of the aluminum plate, and on the contrary, the production of excessive Ti compounds such as $TiB_2$ would be caused to occur as an impurity, thereby causing defects in the aluminum plate. In this regard, the content of Ti should preferably be not more than 0.050 wt %, more preferably not more than 0.04 wt %. Ti is added in the aluminum plate as an Al—Ti alloy or as an Al—B—Ti alloy.

Cu is a very important element in controlling the electrolytic roughening treatment of the aluminum plate, and at the same time, is effective in improving the strength of the lithographic printing plate. In this regard, the content of Cu should preferably be not less than 0.001 wt %. On the other hand, if the content of Cu exceeds over 0.05 wt %, the cost of the raw material would be increased, and still more, an adverse influence is likely to given to the electrolytic roughening treatment of the aluminum plate. Therefore, the content of Cu should preferably be not more than 0.05 wt %.

Mg is an important element in controlling the electrolytic roughening treatment of the aluminum plate, and at the same time, is effective in improving the strength of the lithographic printing plate. In this regard, the content of Mg should preferably be not less than 0.001 wt %. On the other hand, if the content of Mg exceeds over 0.1 wt %, the cost of the raw material would be increased. Therefore, the content of Mg should preferably be not more than 0.1 wt %.

The balance of the aluminum plate is composed of Al and other unavoidable impurities. Examples of these unavoidable impurities include Ga, V and Pb.

The aluminum plate to be employed as the presensitized plate of the present invention can be manufactured by the following method, for example. First of all, a molten aluminum containing desired elements is prepared. The molten aluminum is then subjected to a cleaning treatment to remove unnecessary gas such as hydrogen or solid impurities that have been contained in the molten aluminum. As for the cleaning treatment for removing the unnecessary gas, employed is for example a flux treatment or a degassing treatment using argon gas, chlorine gas or the like. As for the cleaning treatment for removing solid impurities, employed is for example a filtering treatment using a so-called rigid media filter such as a ceramic tube filter, a ceramic foam filter; a filter employing an alumina flake or an alumina ball as a filter medium; or a glass cloth filter. Further, a cleaning treatment can be employed, in which the degassing treatment and the filtering treatment are combined.

Then, the molten aluminum is cast by means of either a casting method using a stationary mold represented by a DC casting method or a casting method using a movable mold represented by a continuous casting method. In the case of the DC casting method, since a cast ingot having a thickness of 300 mm to 800 mm is manufactured, a surface layer of 1 mm to 30 mm in thickness, preferably 1 mm to 10 mm in thickness is shaved off by scalping according to the conventional method. Thereafter, if desired, a soaking treatment is performed for the cast ingot. If the soaking treatment is performed, the heat treatment thereof should be carried out at a temperature of 450° C. to 620° C. for 1 hour to 48 hours so as not to generate enlarged intermetallic compounds. When the period of the heat treatment is less than one hour, the effect of the soaking treatment may become insufficient.

Subsequently, the cast ingot is subjected to a hot rolling and also to a cold rolling to form a rolled aluminum plate. The starting temperature of the hot rolling should preferably be in the range of 350° C. to 500° C. An intermediate annealing treatment may be performed before or after the cold rolling or in the middle of the cold rolling. The intermediate annealing treatment can be performed under the heating conditions: 280° C. to 600° C. in temperature for 2 hours to 20 hours, preferably 350° C. to 500° C. for 2 hours to 10 hours when a batch type annealing furnace is employed, or under the heating conditions of: 400° C. to 600° C. in temperature for not more than 6 minutes, preferably 450° C. to 550° C. in temperature for not more than 2 minutes when a continuous annealing furnace is employed. It is also possible to make the crystal structure of the aluminum plate fine by heating the aluminum plate at a heating rate of 10° C./sec or more by use of the continuous annealing furnace.

In the aluminum plate of the present invention, the crystal grains located within a region ranging from the surface to a depth of 50 μm of the aluminum plate should preferably have an average width of not more than 80 μm (more preferably, not more than 50 μm) and a maximum width of not more than 150 μm (not more than 120 μm) in a direction perpendicular to a rolling direction of the aluminum plate (the width in this direction is hereinafter referred simply to as "width"), and have an average length of not more than 400 μm (preferably, not more than 350 μm) and a maximum length of not more than 500 μm (preferably, not more than 450 μm) in the rolling direction of the aluminum plate (the length in this direction is hereinafter referred simply to as "length"). The crystal grains can be adjusted as described above by a method wherein the annealing by means of the continuous annealing furnace is performed after the hot rolling, or by a method wherein the annealing by means of the continuous annealing furnace is performed after performing the cold rolling one or more times subsequent to the hot rolling.

When the size of the crystal grains existing in the region ranging from the surface of the aluminum plate to a predetermined depth thereof is made not more than a predetermined value, the number of crystal grains per unit area can be increased. Since the metallic structure of the aluminum plate is consisted of crystal grains and grain boundaries thereof, the fact that there are a far large number of crystal grains means that there are a far large number of crystal boundaries together with a far large number of crystal grains. Therefore, when there are a far large number of crystal grains and grain boundaries, the propagation of minute cracks caused by repetition of the bending would be suppressed, thereby making it possible to suppress the fatigue fracture of the lithographic printing plate, which has been heretofore a problem. Especially, since minute cracks are more likely to be generated in the vicinity of the surface of the plate, the crystal grains existing in the region ranging from the surface of the plate to a depth of 50 μm thereof become a key.

As for the method of confirming the features of crystal grains, an ordinary macroetching method may be employed. However, since at least one surface of the presensitized plate of the present invention is roughened or coated with a photosensitive layer, and the other surface which is not coated with the photosensitive layer may also be coated with a protective layer for suppressing the elution of Al during the development, so that it would be often difficult to confirm the features of crystal grains by means of a simple macromatic etching. Therefore, it would be more appropriate that the surface of the aluminum plate is subjected to mirror-finishing by means of a mechanical polishing or an electrochemical polishing, and the resultant plate is subsequently etched by use of a predetermined etching solution so as to facilitate the observation of crystal grains prior to the actual observation of the features of crystal grains.

As for the mechanical polishing methods, there are a method using an abrasive paper, and a method using a puff and an abrasive agent. As for the electrochemical polishing method, a DC electrolytic polishing method performed in sulfuric acid or phosphoric acid.

As for the etching solution for facilitating the observation of crystal grains, an aqueous solution of hydrofluoric acid or a mixed aqueous solution containing a plurality of acids can be employed.

The observation of crystal grains can be performed by taking photographs of samples which have been polished and etched by use of an optical microscope using a polarizing filter. Based on the photographs, the widths and the lengths of crystal grains can be measured to determine the average values and the maximum values of the widths and the lengths.

In order to extend the crystal grain to an appropriate length, it may be preferable to perform a cold rolling after the annealing. As a result, the tensile strength of the plate can be increased, and at the same time, since each of the crystal boundaries is extended in the rolling direction, it becomes possible to suppress propagation of cracks in the width direction of the plate. However, if the plate is extended more than necessary, the number of crystal grains per unit area would be unpreferably decreased.

The aluminum plate finished so as to have a predetermined thickness, e.g. 0.1 mm to 0.5 mm by means of the cold rolling may be further improved in flatness thereof by means of a level controlling apparatus such as a roller leveler or a tension leveler. Additionally, the aluminum plate is usually passed through a slitter line to be processed into an aluminum plate having a predetermined width.

On the surface of the aluminum plate thus obtained, a photosensitive layer is formed, thus accomplishing the presensitized plate. However, preferably, the surface of the aluminum plate may be subjected to a roughening treatment and an anodizing treatment prior to the formation of the photosensitive layer, thereby accomplishing the presensitized plate.

The roughening treatment can be performed by means of a mechanical roughening treatment, an electrolytic roughening treatment, a chemical roughening treatment, etc. These treatments can be performed singly or in combination thereof.

It is especially preferable in the presensitized plate that concave pits having an average opening diameter of not more than 0.6 μm and an average ratio of a depth of a concave pit to an opening diameter thereof (pit depth/pit diameter) ranging from 0.15 to 1.0 are formed on the surface of the aluminum plate prior to the formation of the photosensitive layer.

The mechanical roughening treatment, the electrolytic roughening treatment, the chemical roughening treatment, or the like of the aluminum plate can be performed in the same manner and conditions as generally employed. On the other hand, the formation of the concave pits having the aforementioned features is preferably performed by a method wherein an aluminum alloy plate is subjected at first to an electrochemical roughening treatment in an aqueous solution of nitric acid and then, to an electrochemical roughening treatment in an aqueous solution of hydrochloric acid.

The aluminum alloy plate is subjected to the roughening treatment including an electrochemical roughening treatment. The electrochemical roughening treatment may be performed in combination with a mechanical roughening treatment or a chemical etching treatment. The chemical etching treatment should be preferably performed before or after the mechanical roughening treatment and the electrochemical roughening treatment.

Further, each of the roughening treatment and the chemical etching treatment may be repeated twice or more. With respect to the order of performing the roughening treatment and the chemical etching treatment, there is no particular limitation.

According to an especially preferable manufacturing method of a presensitized plate, the aluminum plate is subjected to the manufacturing processes in the following order.

1) A step of mechanical roughening treatment;

2) A step of etching treatment in an alkaline aqueous solution (a first alkaline etching treatment);

3) A step of desmutting treatment in an acidic aqueous solution (a first desmutting treatment);

4) A step of electrochemical roughening treatment in an aqueous solution mainly composed of nitric acid (a first electrochemical roughening treatment);

5) A step of etching treatment in an alkaline aqueous solution (a second alkaline etching treatment);

6) A step of desmutting treatment in an acidic aqueous solution (a second desmutting treatment);

7) A step of electrochemical roughening treatment in an aqueous solution mainly composed of hydrochloric acid (a second electrochemical roughening treatment);

8) A step of etching treatment in an alkaline aqueous solution (a third alkaline etching treatment); and 9) A step of desmutting treatment in an acidic aqueous solution (a third desmutting treatment).

Note that water washing is preferably interposed between every processes (treatments) in the aforementioned processes 1) to 9). However, when the two successive processes (treatments) employ a solution of the same composition, the water washing may be omitted.

As mentioned above, although the roughening treatments (mechanical roughening treatment and electrolytic roughening treatment) and the chemical etching treatments can be performed in the same manner and conditions as generally employed, the formation of the concave pits according to the present invention should preferably be performed by a method and under conditions as explained below.

The mechanical roughening treatment can be advantageously performed by use of a rotational nylon brush roll having a bristle diameter ranging from 0.2 mm to 1.61 mm and a slurry supplied to the surface of the aluminum plate. As for the abrasive agent to be employed in this case, although publicly known abrasive agents can be employed, it is more preferable to employ silica sand, quartz, aluminum hydroxide, or a combination thereof. The details of the abrasive agents are set forth in JP 06-135175 A and in JP 50-40047 B. The specific gravity of the slurry should preferably be in the range of 1.05 to 1.3. The mechanical roughening treatment can be performed by any desired method such as a slurry spraying method, a method using a wire brush or a method of transferring a roughened surface features of a roller onto the surface of the aluminum plate. Other mechanical roughening methods are set forth in JP 61-074898 A; JP 63-162351 A; JP 63-104889 A and the like.

The concentration of the alkaline aqueous solution employed in a chemical etching treatment is preferably 1 wt % to 30 wt %, and the alkaline aqueous solution may contain 0 wt % to 10 wt % of aluminum or alloy components contained in the aluminum alloy. As for the alkaline aqueous solution, an aqueous solution mainly composed of caustic soda is preferable for use. The etching treatment can be preferably performed at a liquid temperature ranging from a room temperature to 95° C. for 1 sec to 120 sec. Upon finishing the etching treatment, the solution-squeezing by means of nip rollers and the water-washing with a spray are preferably performed so as not to permit the treatment solution to be carried into the next process.

A dissolved amount of the aluminum plate in the first alkaline etching treatment should preferably be 0.5 g/m$^2$ to 30 g/m$^2$, more preferably 1.0 g/m$^2$ to 20 g/m$^2$, most preferably 3.0 g/m$^2$ to 15 g/m$^2$.

The dissolved amount of the aluminum plate in the second alkaline etching treatment should preferably be 0.001 g/m$^2$ to 30 g/m$^2$, more preferably 0.1 g/m$^2$ to 4 g/m$^2$, most preferably 0.2 g/m$^2$ to 1.5 g/m$^2$.

The dissolved amount of the aluminum plate in the third alkaline etching treatment should preferably be 0.001 g/m$^2$ to 30 g/m$^2$, more preferably 0.01 g/m$^2$ to 0.8 g/m$^2$, most preferably 0.02 g/m$^2$ to 0.3 g/m$^2$.

Since smut is usually generated on the surface of the aluminum plate when a desmutting treatment in a chemical etching in an alkaline aqueous solution are performed, the desmutting treatment should preferably be performed by use of phosphoric acid, nitric acid, sulfuric acid, chromic acid, hydrochloric acid or a mixed acid containing two or more of these acids. The concentration of the acidic aqueous solution employed in the desmutting treatment is preferably 0.5 wt % to 60 wt %, and the acidic aqueous solution may contain 0 wt % to 5 wt % of aluminum or alloy components contained in the aluminum alloy. The desmutting treatment can be preferably performed at a liquid temperature ranging from a room temperature to 95° C. for 1 sec to 120 sec. Upon finishing the desmutting treatment, the solution-squeezing by means of nip rollers or the water-washing by means of spraying is preferably performed so as not to permit the treatment solution to be carried into the next process.

Next, description will be made on the aqueous solution employed in the electrochemical roughening treatment in the manufacture of the aforementioned support.

The aqueous solution mainly composed of nitric acid may be those employed in the ordinary electrochemical roughening treatment using a direct current or an alternating current. Specifically, it is possible to employ a 1–100 g/L aqueous nitric acid solution containing at least one kind of hydrochloric acid compound or at least one kind of nitric acid compound at a concentration ranging from 1 g/L up to the saturation thereof, wherein the nitric acid compound is selected from those containing nitrate ion such as aluminum nitrate, sodium nitrate, ammonium nitrate, and the hydrochloric acid compound is selected from those containing hydrochloric ion such as aluminum chloride, sodium chloride, ammonium chloride. The aqueous solution mainly composed of nitric acid may contain metals, in a dissolved state, such as iron, copper, manganese, nickel, titanium, magnesium, silica, which are included in the aluminum alloy. It is especially preferable to employ a 0.5 wt % to 2 wt % aqueous solution of nitric acid which is added with aluminum chloride or aluminum nitrate in such an amount that the concentration of an aluminum ion becomes within the range of 3 g/L to 50 g/L. The temperature of the aqueous solution should preferably be within the range of 10° C. to 90° C., more preferably, within the range of 40° C. to 80° C.

The aqueous solution mainly composed of hydrochloric acid may be those employed in the ordinary electrochemical roughening treatment using a direct current or an alternating current. Specifically, it is possible to employ a 1–100 g/L aqueous hydrochloric acid solution containing at least one kind of hydrochloric acid compound or at least one kind of nitric acid compound at a concentration ranging from 1 g/L up to the saturation thereof, wherein the nitric acid compound is selected from those containing nitrate ion such as aluminum nitrate, sodium nitrate, ammonium nitrate, and the hydrochloric acid compound is selected from those containing hydrochloric ion such as aluminum chloride, sodium chloride, ammonium chloride. The aqueous solution mainly composed of hydrochloric acid may contain metals in a dissolved state, such as iron, copper, manganese, nickel, titanium, magnesium, silica, which may be included in the aluminum alloy. It is especially preferable to employ a 0.5 wt % to 2 wt % aqueous solution of hydrochloric acid which is added with aluminum chloride or aluminum nitrate in such an amount that the concentration of an aluminum ion becomes within the range of 3 g/L to 50 g/L. The temperature of the aqueous solution should preferably be within the range of 10° C. to 60° C., more preferably, within the range of 20° C. to 50° C. Hypochlorous acid may be added to the aqueous solution of hydrochloric acid.

Figure 2:
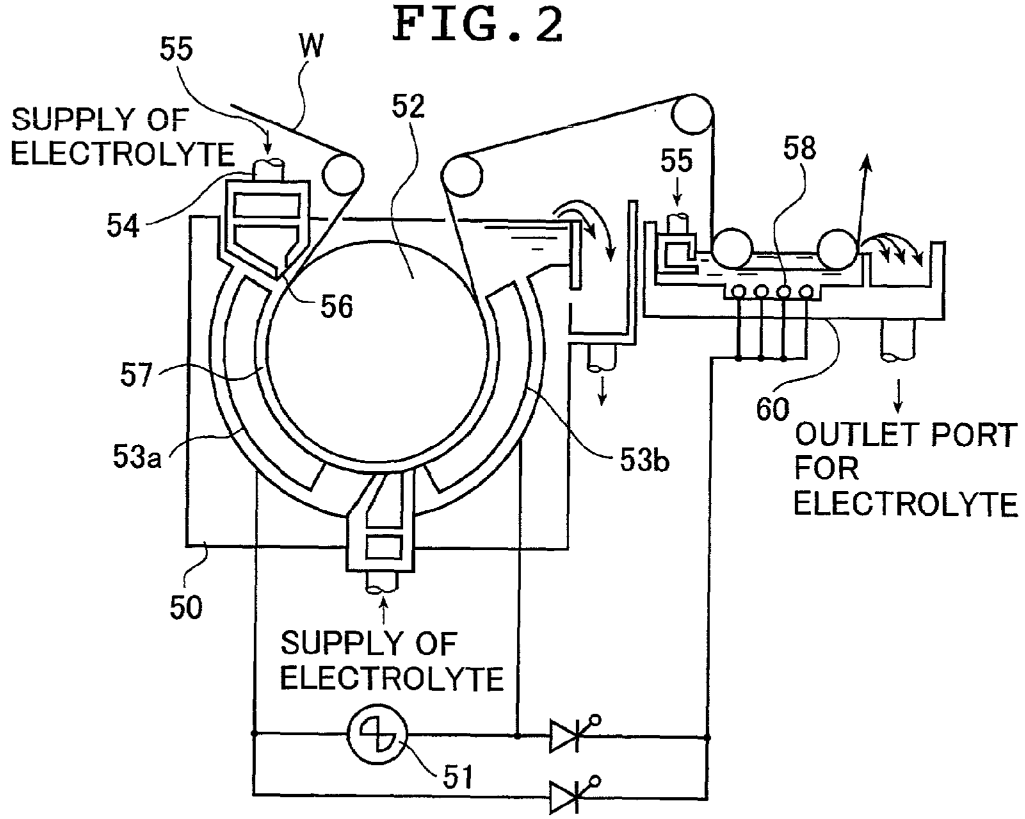
FIG. 2 is a schematic view illustrating one example of the electrolytic apparatus employed in the electrochemical roughening treatment according to the present invention.

The aqueous solution mainly composed of nitric acid which is employed in the electrochemical roughening treatment using an alternating current may be selected from those employed in the ordinary electrochemical roughening treatment using a direct current or an alternating current. Advantageously, it can be selected from the aforementioned aqueous solution mainly composed of nitric acid and the aforementioned aqueous solution mainly composed of hydrochloric acid. The waveform of an AC power source employed in the electrochemical roughening treatment may be a sine wave, a rectangular wave, a trapezoidal wave, a triangular wave, etc. Among them, the rectangular wave and the trapezoidal wave are preferable, and the trapezoidal wave is most preferable. The frequency of the AC power source should preferably be in the range of 0.1 Hz to 250 Hz. FIG. 1 shows a diagram of a trapezoidal waveform as one example of a waveform of the AC power source preferably employed in the electrochemical roughening treatment of the present invention. In FIG. 1, ta is an anode reaction time; tc is a cathode reaction time; "tp" is a time for the current to increase from zero to a peak; Ia is the peak current on the anode cycle side; and Ic is the peak current on the cathode cycle side. In this trapezoidal waveform, the time tp for the current to increase from zero to a peak preferably be within the range of 1 msec to 10 msec. Due to the influence by impedance of a power source circuit, if the time tp is less than 1 msec, a large power source voltage would be required at the rising moment of the current waveform thus leading to an increase in cost for the power source installation. On the other hand, if the tp is larger than 10 msec, the roughening treatment would be more likely to be affected by the trace components in the electrolyte, thereby making it difficult to perform a uniform roughening. Conditions in each cycle of an alternating current employed in the electrochemical roughening treatment should preferably be such that: a ratio of the cathode reaction time tc to the anode reaction time ta (tc/ta) is within the range of 1 to 20; a ratio of a quantity of electricity Qc when the aluminum plate the cathode to a quantity of electricity Qa when the aluminum plate is the anode (Qc/Qa) is within the range of 0.3 to 20; and the anode reaction time ta is within the range of 5 msec to 1000 msec. More preferably, the ratio tc/ta should be within the range of 2.5 to 15. Likewise, the ratio Qc/Qa should more preferably be within the range of 2.5 to 15. The current density of the peak current of the trapezoidal wave on the anode cycle side Ia as well as on the cathode cycle side Ic should preferably be both within the range of 10 $A/dm^2$ to 200 $A/dm^2$. The ratio Ic/Ia should preferably be within the range of 0.3 to 20. The total quantity of electricity which is required for the anode reaction of the aluminum plate at the moment when the electrochemical roughening treatment has been finished should preferably be within the range of 25 $C/dm^2$ to 1000 $C/dm^2$. An electrolytic bath employed in the electrochemical roughening treatment using an alternating current according to the present invention may be selected from publicly known baths employed in the surface treatment such as a vertical type bath, a flat type bath and a radial type bath. Among them, the radial type electrolytic bath that is set forth in JP 05-195300 B is especially preferable. The electrolyte to be circulated in the electrolytic bath may be parallel with or counter to the advancing direction of the aluminum web. One or more AC power sources may be connected with a single electrolytic bath. Two or more electrolytic baths may be employed. The apparatus shown in FIG. 2 can be employed for the electrochemical roughening treatment using an alternating current. Referring to FIG. 2, the reference number 50 denotes a main electrolytic bath; 51, an AC power source; 52, a radial drum roller; 53*a* and 53*b*, main electrodes; 54, an inlet port for electrolyte; 55, an electrolyte; 56, slit; 58, an auxiliary anode; 60, an auxiliary anode bath; and W, an aluminum plate. In the case where two or more electrolytic baths are employed, the conditions for the electrolysis may be the same with or different from each other. The aluminum plate W is wound around the radial drum roller 52 which is disposed to be immersed in the main electrolytic bath 50, and is subjected to an electrolytic treatment during transfer thereof by the main electrodes 53*a* and 53*b* which are connected with the AC power source 51. The electrolyte 55 is fed from the electrolyte inlet port 54 via the slit 56 to an electrolyte passageway 57 which is interposed between the radial drum roller 52 and the main electrodes 53*a* and 53*b*. The aluminum plate W thus treated in the main electrolytic bath 50 is then subjected to an electrolytic treatment in the auxiliary anode bath 60. Inside this auxiliary anode bath 60, the auxiliary anode 58 is disposed so as to face the aluminum plate W, and the electrolyte 55 is fed to flow through a space between the auxiliary anode 58 and the aluminum plate W.

The electrochemical roughening treatment using a direct current is a method wherein a direct current is applied between the aluminum plate and the electrodes facing the aluminum plate, thereby electrochemically roughening the aluminum plate. The electrolyte may be selected from those employed in the publicly known electrochemical roughening treatment using a direct current or an alternating current. Advantageously, it can be selected from the aforementioned aqueous solution mainly composed of nitric acid and the aforementioned aqueous solution mainly composed of hydrochloric acid. The temperature of the electrolyte should preferably be within the range of 10° C. to 80° C. As for the apparatus employed in the electrochemical roughening treatment using a direct current, the publicly known ones using a direct current would be also useful in the present invention. However, an apparatus where one or more pairs of an anode and a cathode are alternately arranged as set forth in JP 01-141094 A can be preferably employed. Examples of the publicly known apparatus useful in this case are set forth in Japanese Patent Application No. 05-68204; Japanese Patent Application No. 06-205657; Japanese Patent Application No. 06-21050; JP 61-19115 A; and JP 57-44760 B. A direct current may be applied between a conductor roll, which is contacted with the aluminum plate and a cathode facing the conductor roll, thereby performing an electrochemical roughening treatment using the aluminum plate as an anode. Upon finishing the electrolytic treatment, the solution-squeezing by means of nip rollers or the water-washing by means of spraying is preferably performed so as not to permit the treatment solution to be carried into the next process. The direct current employed for the electrochemical roughening treatment should preferably be a direct current exhibiting a ripple rate of 20% or less. Preferably, the current density of the direct current should be within the range of 10 $A/dm^2$ to 200 $A/dm^2$, and the quantity of electricity when the aluminum plate is the anode should be within the range of 25 $C/dm^2$ to 1000 $C/dm^2$. The anode employed in this case can be selected from publicly known oxygen-generating electrodes such as electrodes formed by cladding or plating ferrite, indium oxide or platinum on a valve metal such as titanium, niobium, and zirconium. The cathode employed in this case can be selected from electrodes formed of carbon, platinum, titanium, niobium, zirconium, and stainless steel, and an electrode employed as a cathode for a fuel battery.

As a result of the aforementioned roughening treatment, the surface of the aluminum alloy plate is provided with concave pits each having a specific feature, i.e. an average opening diameter of not more than 0.6 μm at the opening thereof and an average ratio of the depth of the concave pit to the opening diameter thereof ranging from 0.15 to 1.0 (pit depth/pit diameter). More preferably, the average opening diameter of the concave pits should be not more than 0.3 μm but not less than 0.02 μm. Further, the average ratio of the depth of the concave pit to the opening diameter thereof should more preferably be not less than 0.2 but not more than 0.5.

The average opening diameter of the concave pits on the surface of the aluminum support, and the average ratio of the depth of the concave pit to the opening diameter thereof can be determined as follows. As for the aluminum support, an aluminum support may be employed, which is not yet provided with an image-recording layer, or an aluminum support obtained by removing the image-recording layer from a presensitized plate may be employed.

(1) The average opening diameter of the concave pits:

As for the method of measuring the average opening diameter of the concave pits, there are the following two methods 1) and 2). The results measured by the present inventor according to both of these methods were found the substantially same with each other.

1) The photographs of the surface of the aluminum support is taken at a magnification of 50000 times from the top thereof by use of a field emission type scanning electron microscope (FE-SEM, for example, S-900; Hitachi Manufacturing Co., Ltd.). Then, a straight line of 10 cm in length (corresponding to 2 μm) is drawn on the SEM photograph or on a copy thereof, and the diameter of opening (=(longer diameter/shorter diameter)/2) of the concave pit through which the straight line passes is measured. The measurement of the opening diameter is continued until the number of the concave pits whose opening diameter has been measured becomes at least 20, which is followed by the calculation of the average opening diameter.

2) The photograph of the surface of aluminum support is taken at a magnification of 50000 times from the top thereof by use of the FE-SEM. The SEM photograph thus obtained is captured as an image data into a computer by use of a scanner. Thereafter, an average opening diameter of the concave pits is determined by use of image processing software available in the market.

(2) The average ratio of the depth of the concave pit to the opening diameter thereof:

As for the method of measuring the average ratio of the depth of the concave pit to the opening diameter thereof, there are following four methods 1) to 4). The results measured by the present inventor according to all of these methods were found the substantially same with each other.

1) The aluminum support is bent at an angle of 90 degrees or more in such a manner that the roughened surface of the aluminum support is directed outward, and is then fixed to a sample bed with a conductive paste. Then, by means of the FE-SEM, the photographs of the cracked portion of the anodized layer at the bent portion of the aluminum support is taken at a magnification of 50000 times. Based on the photographs thus taken, the opening diameters and the depths of at least the ten concave pits are measured, and then, the depth of the concave pit to the average opening diameter thereof is calculated. Note that, as for the method of measuring the opening diameter of the concave pit, the aforementioned method 1) of (1) can be utilized. Further, as for the depth of the concave pit, the depth which is deepest is selected.

2) The aluminum support is enclosed with a resin, and the resultant body is polished by means of an automatic polishing machine to produce a cross-section. Thereafter, the aforementioned measurements are performed in the same manner as described in the above item 1) by means of the FE-SEM.

3) By use of a microtome, the aluminum support is cut to form the cross-section. Thereafter, the aforementioned measurements are performed in the same manner as described in the above item 1) by means of the FE-SEM.

4) The cross-section of the aluminum support is prepared in combination of the method of the above item 2) and the method of the above item 3). Thereafter, the aforementioned measurements are performed in the same manner as described in the above item 1) by means of the FE-SEM.

When the minute concave pits are formed on the surface of the aluminum plate, the surface area of the aluminum plate is increased, thereby enhancing the adhesive force of the aluminum plate to a recording layer (image area). As a result, when the aluminum plate is formed into a presensitized plate, the peeling of the image area or a partial missing of the image area can be prevented, thus providing an extremely excellent press life.

In order to enhance the abrasive resistance of the surface of the aluminum plate, it is preferable to perform the anodizing treatment subsequent to the roughening treatment. The electrolyte employed in the anodizing treatment may be of any kind as long as the electrolyte is capable of forming a porous oxide film. For example, sulfuric acid, phosphoric acid, oxalic acid, chromic acid or a mixture thereof can be generally employed as the electrolyte. The concentration of the electrolyte can be suitably determined depending on the kind of electrolyte. Since the conditions for the anodizing treatment are varied depending on the kind of electrolyte, it is difficult to define the conditions for the anodizing treatment. Generally however, the conditions for the anodizing treatment may be as follows: the concentration of the electrolyte of 1% to 80 wt %; the temperature of the electrolyte of 5° C. to 70° C.; the current density of 1 A/dm$^2$ to 60 A/dm$^2$; the voltage of 1V to 100V; and a time of electrolysis of 10 sec to 300 sec.

Upon finishing the roughening treatment and the anodizing treatment as described above, the surface of the aluminum plate is coated with a photosensitive materials, and then dried to form a photosensitive layer, thereby accomplishing a presensitized plate. As for the photosensitive materials, there is no particular limitation, and hence photosensitive materials generally employed in photosensitive lithographic printing plates can be employed.

For example, a positive photosensitive layer composed of novolac resin and naphthoquinone diazide, or a negative photosensitive layer composed of diazo-based resin or photopolymer resin can be employed in the presensitized plate. The presensitized plate obtained through the formation of such photosensitive layer is subjected to exposure of an image by use of a lith film, developing, and then gumming, thereby accomplishing a lithographic printing plate which is ready for attachment to a printing machine.

Further, when a raw material sensitive to a laser beam is employed for a photosensitive layer, an image can be directly exposed by use of laser. Examples of such a photosensitive layer include a photosensitive layer composed of an infrared absorbent, a compound generating an acid as heated, and a compound which is cross-linked by an acid; a photosensitive layer composed of an infrared absorbent, a compound generating an acid as heated, and a compound having a linked portion which is decomposed by an acid; a photosensitive layer including two layers of a layer composed of a compound generating a radical by irradiation of a laser beam, an alkali-soluble binder and a multi-functional monomer or prepolymer, and an oxygen-shielding layer; a photosensitive layer including two layers of a physical development center layer and a silver halide emulsion layer; a photosensitive layer including three layers of a polymerizing layer composed of a multi-functional monomer and a multi-functional binder, a layer composed of silver halide and a reducing agent, and an oxygen-shielding layer; a photosensitive layer including two layers of a layer composed of novolac resin and naphthoquinone diazide, and a layer composed of silver halide; a photosensitive layer composed of an organic photoconductive body; a photosensitive layer including a laser beam absorbing layer to be eliminated by irradiation of a laser beam, a lipophilic layer and/or a hydrophilic layer; and a photosensitive layer composed of a compound generating an acid through absorption of energy, a high-molecular compound having a functional group on a side chain thereof, which generates sulfonic acid or carboxylic acid with an acid, and a compound giving an energy to an acid-generating agent through the absorption of visible light. Other examples of the photosensitive layer include an image-recording layer (photosensitive layer) which is set forth in Japanese Patent Application No. 2001-276265.

The presensitized plate of the present invention which is obtained as described above is featured in that a fatigue fracture strength after the heat treatment thereof at 300° C. for 7 minutes is not less than 75%, more preferably not less than 80% of that before the heat treatment. As long as the presensitized plate is limited by the aforementioned numerical ranges, it would be possible to prevent the generation of fatigue fracture during printing even if the presensitized plate has been subjected to a burning treatment.

The burning treatment is usually performed at a temperature of 200° C. or more, in particular at a temperature ranging from 240° C. to 270° C. However, the present inventor has taken the notice of the fatigue fracture strength after the heat treatment for 7 minutes at 300° C., which is higher than the aforementioned conventional temperature range, and of the fatigue fracture strength before the aforementioned heat treatment. As a result, it has been found that as long as the fatigue fracture strength after the heat treatment is maintained at more than a certain rate of that before the heat treatment, the generation of fatigue fracture during the printing can be prevented even if the burning treatment has been performed, thereby accomplishing the present invention.

As for the method for maintaining the aforementioned relationship between the fatigue fracture strength after the heat treatment at 300° C. for 7 minutes and the fatigue fracture strength before the aforementioned heat treatment, it is possible to adopt a method of employing an aluminum plate wherein the crystal grains located within a region ranging from the surface of the aluminum plate to a depth of 50 μm have an average width of not more than 80 μm and a maximum width of not more than 150 μm in the direction perpendicular to the rolling direction of the aluminum plate, and have an average length of not more than 400 μm and a maximum length of not more than 500 μm in the rolling direction of the aluminum plate.

The fatigue fracture strength in the present invention is measured as follows.

First of all, a halftone dot image area is printed all over the presensitized plate in such a manner that the area of the image area becomes 50% of the total area. The exposure of the image area can be performed either by a method of executing an exposure while closely contacting a lith film to the presensitized plate, or by a method of scanning with a laser beam so as to form a predetermined halftone dot if a laser beam direct-drafting type photosensitive material is employed. Subsequently, the presensitized plate is subjected to a development process to thereby obtain a lithographic printing plate having a halftone dot image area occupying 50% of the total area and a non-image area. The development process can be performed by a method wherein the non-image area is removed by use of a developer, or by a method wherein a slight degree of heating is performed at a temperature ranging from 50° C. to 150° C. Note that the reason for providing such an image area is to uniformly perform the heating all over the surface.

Next, the lithographic printing plate thus obtained is cut to have a size for use in the fatigue fracture test, specifically, 20 mm in width in the direction perpendicular to the rolling direction of the plate, and 100 mm in length in the rolling direction of the plate. A plurality of samples obtained from the same lithographic printing plate are then divided into a group of samples for determining the fatigue fracture strength after heating and another group of samples for determining the fatigue fracture strength before heating.

Thereafter, the group of samples for determining the fatigue fracture strength after heating are subjected to a heating at 300° C. for 7 minutes. The heating is performed using an apparatus which is capable of uniformly heating all over the surface. Examples of such a heating apparatus include a radiation type heating apparatus. Specific examples of such a radiation type heating apparatus include PLANO PS burning processor 1300 (Fuji Photo Film Co., Ltd.).

Then, a slight degree of tension is applied to each of the samples which was heated and also to the sample which was not heated in such a manner that the tension per unit cross-section becomes about 1.0 kg/mm$^2$, and under the condition wherein one end of the sample is fixed, a vibration is given to the sample in such a way that the amplitude of the other end of the sample would become about 5 mm, and the number of vibration until sample is fractured is counted. In this manner, the fatigue fracture strength after the heating at 300° C. for 7 minutes and the fatigue fracture strength before the heating are determined.

In the presensitized plate according to the present invention, the 0.2% proof stress after the heat treatment of the presensitized plate at 300° C. for 7 minutes should preferably be 65% or more of that before the heat treatment. As long as the 0.2% proof stress is within the aforementioned range, rigidity against the bending of the presensitized plate would become appropriate after the heat treatment, thereby making it possible to perform the bending of the presensitized plate for attachment thereof onto the plate cylinder without raising any problems. On the other hand, if the 0.2% proof stress falls outside the aforementioned range, it would become difficult to uniformly perform the bending in the width direction after the heat treatment, thereby making it impossible to uniformly attach the presensitized plate to the plate cylinder, and hence giving rise to the generation of cracking during the printing.

In the present invention, the expression of "0.2% proof stress" is a load where a permanent elongation becomes 0.2% in a tensile strength test. This 0.2% proof stress can be determined in conformity with a regulation of JIS Z2241-1993. Note that the heating can be performed in the same manner as explained with reference to the aforementioned fatigue fracture strength.

EXAMPLES

The present invention will be further explained in detail with reference to the following various examples, which are not intended to limit this invention.

Examples 1–3 and Comparative Examples 1–4

1-1. Manufacture of presensitized plate:

The aluminum alloys 1–3, each having a composition shown in Table 1, were respectively subjected to a DC casting to obtain a cast ingot, and after the surface thereof was cut, the resultant cast ingot was subjected successively to a soaking treatment, a hot rolling, an intermediate annealing and a cold rolling to obtain an aluminum plate having a thickness of 0.29 mm. In this case, the conditions for the intermediate annealing and the hot rolling were varied so as to obtain presensitized plates wherein the size of an aluminum crystal grain was varied from each other. The aluminum alloys 1 and 2 were formed of JIS A1000 type materials having an aluminum purity of 99 wt % or more, which were employed in the present invention, while the aluminum alloy 3 was formed of JIS A3000 type materials having an aluminum purity of less than 99 wt %.

Each of the aluminum plates thus obtained was subjected to a brush graining treatment while feeding a pumice suspension to the surface thereof, hereby performing the mechanical roughening treatment. After water-washing, the surface of aluminum plate was subjected to a chemical etching treatment using an aqueous solution of caustic soda, which was followed by water-washing and a desmutting treatment using nitric acid. After water-washing, the aluminum plate was subjected to an AC electrolysis in an aqueous solution of nitric acid, thereby performing the electrochemical roughening treatment of the aluminum plate. After water-washing, the aluminum plate was subjected to a slight degree of the etching treatment with a diluted aqueous solution of caustic soda, which was followed by water-washing and a desmutting treatment with an aqueous solution of sulfuric acid. Further, after water-washing, the aluminum plate was subjected to a DC electrolysis in an aqueous solution of sulfuric acid, to form an anodized layer, thus obtaining a support for lithographic printing plate.

Furthermore, a photosensitive layer composed of an infrared absorbent, a compound generating an acid as heated, and a compound having a linked portion which is decomposed by an acid was formed on the surface of the support, thus obtaining a presensitized plate.

for printing tests. The number of printed sheets was set to one million, and the rate of samples having cracking generated at the bent portion during the printing (the fracture rate during the printing) was determined. The results are shown in Table 2.

1-6. Measurement on the 0.2% proof stress:

The tensile test was performed on each of the presensitized plates thus obtained to determine the 0.2% proof stress. The 0.2% proof stress was determined in conformity with the regulation set forth in JIS Z2241-1993. Note that the heating was performed by the same method as in the case of measuring the fatigue fracture strength. The results are shown in Table 2.

TABLE 1

| Aluminum alloy | Fe (wt %) | Si (wt %) | Ti (wt %) | Cu (wt %) | Mg (wt %) | Mn (wt %) | Others (wt %) | Al (wt %) | REMARKS |
|---|---|---|---|---|---|---|---|---|---|
| 1 | 0.30 | 0.07 | 0.03 | 0.015 | 0.014 | 0.001 | 0.02 | 99.55 | JIS A1000 material |
| 2 | 0.20 | 0.03 | 0.005 | 0.002 | 0.002 | 0.000 | 0.02 | 99.74 | JIS A1000 material |
| 3 | 0.30 | 0.25 | 0.02 | 0.30 | 0.30 | 1.10 | 0.03 | 97.7 | JIS A3000 material |

1-2. Measurement of fatigue fracture strength:

Each of the presensitized plates thus obtained was subjected to a development treatment wherein a halftone dot image area is exposed all over the presensitized plate by use of a laser writing apparatus (a trend setter; Cleo Co., Ltd.) in such a manner that the area of the image area becomes 50% of the total area. 10 samples (20 mm in width and 100 mm in length) were cut out of each of the lithographic printing plates thus obtained. Five samples out of the 10 samples were measured with respect to the fatigue fracture strength without undergoing the heat treatment thereof, and the remaining five samples were heated at a 300° C. for 7 minutes in a radiation type heating apparatus (PLANO PS burning processor 1300; Fuji Photo Film Co., Ltd.), and then the measurement on the fatigue fracture strength thereof was subsequently performed. The results are shown in Table 2.

1-3. Evaluation of stability of the roughening treatment:

After the photosensitive layer was removed, the roughened surface of each of the presensitized plates thus obtained was observed by means of a scanning electron microscope (T-20; Nippon Denshi Co., Ltd.), and then the stability of the roughening treatment was evaluated from the roughened features, in particular, the roughened features that had been generated by the electrolytic roughening treatment. The results are shown in Table 2.

1-4. Evaluation of the cost for the raw materials:

The cost for the raw materials of the aluminum alloys 1–3 employed for each of the presensitized plates thus obtained (the total of the cost for the Al ground metal and the cost for the mother alloy for the trace components to be added) was determined and evaluated. The results are shown in Table 2. Note that the cost for the raw materials was indicated by a relative value wherein the cost for aluminum alloy 2 was set to 100.

1-5. Printing tests:

Each of the presensitized plates thus obtained was subjected to the exposure process and the development process to obtain a lithographic printing plate, and then, to the burning treatment at about 250° C. 100 samples were prepared from each of the presensitized plates and employed 1-7. Measurement on the size of crystal grain:

After the photosensitive layer was entirely removed from each of the presensitized plates thus obtained, the surface thereof was abraded by use of #800 water-proof abrasive paper so as to have the surface roughness Ra (arithmetic mean roughness as defined in JIS B0601-1994 (cut-off value: 0.8 mm; evaluation length: 4 mm)) of about 0.2, which was followed by a buff-polishing of about 1 μm to 1.5 μm by use of an alumina suspension (particle diameter: 0.05 μm) and further followed by an etching treatment of about 0.5 μm to 1.0 μm by use of a 10% aqueous solution of hydrofluoric acid. Therefore, the crystal grain boundary was enabled to be observed in this manner, and the crystal structure was photographed by means of a polarizing microscope. Then, the widths and the lengths of 20 pieces of crystal grains which were located in a region ranging from the surface of the aluminum plate to a depth of 50 μm were measured to thereby determine the average value and the maximum value thereof. The results are shown in Table 2.

In the presensitized plates of the present invention (Examples 1–3), the fatigue fracture strength after the heating at 300° C. for 7 minutes were 75% or more of that before the heating. While the 0.2% proof stress thereof after the heating at 300° C. for 7 minutes was 65% or more of that before the heating. Further, the crystal grain located within a region ranging from the surface of the aluminum plate to a depth of 50 μm was found having an average width of not more than 80 μm and a maximum width of not more than 150 μm in the direction perpendicular to the rolling direction of the aluminum plate, and was also found having an average length of not more than 400 μm and a maximum length of not more than 500 μm in the rolling direction of the aluminum plate. Furthermore, the presensitized plates of the present invention were found free from fatigue fracture during the printing when formed into the lithographic printing plates.

Whereas in the cases where the reduction rate of fatigue fracture strength due to the heating was high (Comparative Example 1–3), the generation of fatigue fracture was recognized during the printing. Among them, Comparative Examples 1 and 3 were found rather small in the reduction rate of the 0.2% proof stress that was caused due to the heating, and the widths and the lengths of the crystal grains thereof were rather large. Comparative Example 2 was found rather large in the reduction rate of the 0.2% proof stress that was caused due to the heating, and the widths and the lengths of the crystal grains thereof were also large.

When the aluminum plate of JIS A3000 material having an aluminum purity of less than 99 wt % was employed (Comparative Example 4), the stability of the roughening treatment was found poor and the cost for the raw materials was high.

TABLE 2-1

| | Aluminum alloy | Fatigue fracture strength Before heating (times) | After heating (times) | B/A × 100 (%) | Stability of roughening treatment | Cost for raw materials | Fatigue Fracture rate during printing |
|---|---|---|---|---|---|---|---|
| Example 1 | 1 | 12000 | 10400 | 87 | excellent | 102 | 0 |
| Example 2 | 2 | 10000 | 8900 | 89 | excellent | 100 | 0 |
| Example 3 | 2 | 10700 | 8200 | 77 | excellent | 100 | 0 |
| Comparative Example 1 | 1 | 11000 | 7500 | 68 | excellent | 102 | 5 |
| Comparative example 2 | 2 | 9700 | 6300 | 65 | excellent | 100 | 10 |
| Comparative example 3 | 2 | 10000 | 7300 | 73 | excellent | 100 | 3 |
| Comparative example 4 | 3 | 20000 | 17000 | 85 | Poor | 120 | 0 |

TABLE 2-2

| | 0.2 % proof stress Before heating (A) (MPa) | After heating (B) (MPa) | B/A × 100 (%) | Width of crystal grain (μm) average | maximum | Length of crystal grain (μm) average | maximum |
|---|---|---|---|---|---|---|---|
| Example 1 | 160 | 120 | 75 | 45 | 70 | 210 | 300 |
| Example 2 | 151 | 111 | 73 | 60 | 90 | 290 | 420 |
| Example 3 | 151 | 104 | 69 | 75 | 140 | 360 | 480 |
| Comparative example 1 | 160 | 117 | 73 | 88 | 200 | 508 | 640 |
| Comparative example 2 | 150 | 95 | 63 | 97 | 280 | 780 | 1500 |
| Comparative example 3 | 150 | 105 | 70 | 105 | 350 | 640 | 950 |
| Comparative example 4 | 220 | 190 | 86 | 50 | 100 | 180 | 280 |

In the above examples, a roughening treatment were performed in combination of the mechanical roughening treatment and the electrolytic roughening treatment, and a photosensitive layer composed of an infrared absorbent, a compound generating an acid as heated, and a compound having a linked portion which is decomposed by an acid was employed. However, the present invention would not be confined to the above examples, and the gist of the present invention is to provide a presensitized plate which is excellent in thermosoftening resistance and fatigue fracture strength after the burning treatment and is free from the cracking during the printing, so that the present invention is of course applicable to all of presensitized plates which are designed to be subjected to the burning treatment.

Examples 4–7

2-1. Manufacture of presensitized plate:

The aluminum alloys plate 2 having a composition shown in Table 1 was treated in the same manner as in the case of Examples 1 to 3 to thereby obtain an aluminum plate. The aluminum plate thus obtained was subjected to the following roughening treatments to obtain supports for lithographic printing plate.

Specifically, the roughening treatment (3) was performed on Example 4; the roughening treatment (1) was performed on Example 5; the roughening treatment (2) was performed on Example 6; and the roughening treatment (3) was performed on Example 7. Further, a photosensitive layer composed of an infrared absorbent, a compound generating an acid as heated, and a compound having a linked portion which is decomposed by an acid was employed to thereby obtain presensitized plates.

<Roughening Treatment (1)>

Upon finishing each roughening treatment, water-washing was performed. The solution-squeezing by means of nip rollers was performed after the roughening treatment as well as after the water-washing.

(a) Mechanical roughening treatment:

Pumice was pulverized and classified so as to make the particles therein have an average particle diameter of 40 μm to thereby obtain an abrasive agent, which was suspended in water to obtain a suspension (specific gravity: 1.12) as an abrasive slurry solution. While the abrasive slurry solution was fed via a spray tube to the surface of the aluminum plate, the mechanical roughening treatment was performed by rotating roller-shaped nylon brush. The Mohs' hardness of the abrasive agent was 5. The abrasive agent was constituted by 73 wt % of $SiO_2$, 14 wt % of $Al_2O_3$, 1.2 wt % of $Fe_2O_3$, 1.34 wt % of CaO, 0.3 wt % of MgO, 2.6 wt % of $K_2O$, and 2.7 wt % of $Na_2O$.

The material of the nylon brush was 6/10 nylon, and the bristle was No.3 brush having a length of 50 mm. The nylon brush was formed by drilling holes in a stainless tube having a diameter of 300 mm and densely implanting the bristles thereon. Three ratatable brushes were employed. The distance between two supporting rollers (200 mm in diameter) disposed at a lower portion of the brush was 300 mm. The brush roller was controlled by a load of the driving motor for rotating the brush based on a load before the brush roller is pressed onto the aluminum plate, and was pressed onto the aluminum plate so as to form an average surface roughness (Ra) of 0.45 μm to 0.55 μm on the surface of aluminum plate after the roughening treatment. The rotating direction of the brush was the same as the moving direction of the aluminum plate. The rotational speed of the brush was 250 rpm.

(b) Etching treatment in an alkaline aqueous solution:

An aqueous solution containing 27 wt % of caustic soda, and 6.5 wt % of an aluminum ion was sprayed onto the aluminum plate through a spray tube at 70° C. to thereby perform the etching treatment of the aluminum plate. The dissolved quantity of aluminum from the roughened surface of the aluminum plate in the subsequent electrochemical roughening treatment was 10 $g/m^2$.

(c) Desmutting treatment in an acidic aqueous solution:

Then, a desmutting treatment was performed in an aqueous solution of nitric acid. As the aqueous solution of nitric acid, a waste solution of nitric acid which was employed in the subsequent electrochemical roughening treatment was employed. The temperature of the solution was 35° C. The desmutting solution was sprayed to perform a four second desmutting treatment.

(d) Electrochemical roughening treatment in an aqueous solution of nitric acid:

An aluminum nitrate was added to an aqueous solution containing nitric acid at a concentration of 9.5 g/L and heated to 50° C. so as to adjust the concentration of an aluminum ion to 5 g/L to thereby obtain an electrolyte for use.

Then, by use of a power source generating an alternating current, an electrochemical roughening treatment was performed. The frequency of the alternating current was 60 Hz and the time Tp for the current to increase from zero to the peak was 0.8 msec. The duty (ta/T) of the alternating current was 0.5.

The current density at the peak of the alternating current on the anode reaction of the aluminum plate was 60 $A/dm^2$, and the ratio of the total of the quantity of electricity in the anode reaction of the aluminum plate to the total of the quantity of electricity in the cathode reaction of the aluminum plate was 0.95. The total quantity of electricity to be applied onto the aluminum plate was 200 $C/dm^2$ at the anode reaction of the aluminum plate.

(e) Etching treatment in an alkaline aqueous solution:

An aqueous solution containing 27 wt % of caustic soda, and 6.5 wt % of an aluminum ion was sprayed onto the aluminum plate through a spray tube at a temperature of 70° C. to thereby perform the etching treatment of the aluminum plate. The dissolved quantity of aluminum from the roughened surface of aluminum plate in the subsequent electrochemical roughening treatment was 3.5 $g/m^2$.

(f) Desmutting treatment in an acidic aqueous solution:

Then, a desmutting treatment was performed in an aqueous solution of sulfuric acid. The aqueous solution of sulfuric acid employed was 300 g/L in concentration of sulfuric acid and 5 g/L in concentration of an aluminum ion. The temperature of the solution was 60° C. The desmutting solution was sprayed thereon to perform a three second desmutting treatment.

(g) Electrochemical roughening treatment in an aqueous solution of hydrochloric acid:

An aluminum chloride was added to an aqueous solution of hydrochloric acid of a concentration of 7.5 g/L at 35° C. so as to adjust the concentration of an aluminum ion to 4.5 g/L to thereby obtain an electrolyte for use.

Then, by use of a power source generating an alternating current of a trapezoidal waveform, an electrochemical roughening treatment was performed. The frequency of the alternating current was 50 Hz and the time Tp for the current to increase from zero to the peak was 0.8 msec. The duty (ta/T) of the alternating current was 0.5.

The current density at the peak of the alternating current in the anode reaction of the aluminum plate was 50 $A/dm^2$, and the ratio of the total of the quantity of electricity in the anode reaction of the aluminum plate to the total of the quantity of electricity in the cathode reaction of the aluminum plate was 0.95. The total quantity of electricity to be applied onto the aluminum plate was 50 $C/dm^2$ in the anode reaction of the aluminum plate.

(h) Etching treatment in an alkaline aqueous solution:

An aqueous solution containing 27 wt % of caustic soda, and 6.5 wt % of an aluminum ion was sprayed onto the aluminum plate through a spray tube at a temperature of 45° C. to thereby perform the etching treatment. The quantity of aluminum dissolved from the electrochemically roughened surface of the aluminum plate was 0.3 $g/m^2$.

(i) Desmutting treatment in an acidic aqueous solution:

Then, a waste solution (5 g/L of an aluminum ion dissolved in 170 g/L aqueous solution of sulfuric acid), which was generated in the anodizing treatment step was utilized. The temperature of the solution was 35° C. The desmutting treatment was performed at a temperature of 35° C. for 4 seconds.

(j) Anodizing treatment in an aqueous solution of sulfuric acid:

A DC electrolysis was performed in a solution containing sulfuric acid at a concentration of 170 g/L and aluminum ion at a concentration of 5 g/L and under the condition of 20 $A/dm^2$ in an average current density. In this case, the anodizing treatment was performed so as to form an anodized layer of 2.7 $g/m^2$. The temperature of the solution was 40° C., the voltage was 5 V to 30 V, and the treatment time was 10 seconds.

<Roughening Treatment (2)>

A roughening treatment was performed in the same manner as in the aforementioned surface treatment (1) except that the quantity of aluminum dissolved from the aluminum plate in the etching treatment in the alkaline aqueous solution of the aforementioned item (h) was 0.1 $g/m^2$.

<Roughening Treatment (3)>

A roughening treatment was performed in the same manner as in the aforementioned surface treatment (1) except that the quantity of aluminum dissolved from the aluminum plate in the etching treatment in the alkaline aqueous solution of the aforementioned item (h) was 0.8 $g/m^2$.

2-2. The features of the concave pit on the surface of the aluminum support:

After the photosensitive layer was removed for each of the presensitized plates thus obtained, the roughened surface thereof was measured with respect to the average opening diameter of the pits on the surface of the aluminum support, and with respect to the ratio of the depth of the pits to the average opening diameter of the pits as follows. The results are shown in Table 3.

(1) Average opening diameter of the concave pit:

A photograph of the surface of the aluminum was taken at a magnification of 50000 times from the top of the aluminum support by use of the FE-SEM (S-900; Hitachi Manufacturing Co., Ltd.). Then, a straight line of 10 cm in length (corresponding to 2 μm) was drawn on the SEM photograph or on a copy thereof, and the opening diameter (=(longer diameter+shorter diameter)/2) of the concave pit through which the straight line passes was measured. The measurement of the opening diameter was continued until the number of the concave pits whose opening diameter had been measured became 20, which was followed by the calculation of the average opening diameter.

(2) The average ratio of the depth of the concave pit to the opening diameter thereof:

The aluminum support was bent at an angle of 90 degrees or more in such a manner that the roughened surface of the aluminum support was directed outward, and was then fixed to a sample bed with a conductive paste. Then, by means of the FE-SEM, the photographs of the cracked portion of the anodized layer at the bent portion of the aluminum support were taken at a magnification of 50000 times. Based on the photographs thus taken, the opening diameters and the depths of the ten concave pits were measured, and then, the average ratio of the depth of the concave pit to the opening diameter thereof was calculated. Note that, as for the method of measuring the opening diameter of the concave pit, the aforementioned method of (1) was utilized. Further, as for the depth of the concave pit, the depth which was deepest was selected.

2-3. Printing tests:

Each of the presensitized plates thus obtained was subjected to the exposure process and the development process to obtain a lithographic printing plate, and then, to the burning treatment at a temperature of about 250° C. 100 samples were prepared from each of the presensitized plates and employed for printing tests. The number of printed sheets was set to one million, and the rate of samples having cracked portions generated at the bent portion during the printing (the fracture rate during the printing) was determined. The results are shown in Table 3.

2-4. The number of sheets exhibiting a defective image:

Each of the presensitized plates thus obtained was subjected to the exposure process and development process to obtain a lithographic printing plate, and then, to the burning treatment at 250° C. Thereafter, the lithographic printing plate was used for a printing test. The number of sheets exhibiting a defective image during the printing was evaluated. The results are shown in Table 3.

TABLE 3

| | Aluminum alloy | Roughening methods | Features of pit: Average opening diameter | Features of pit: Depth/opening diameter ratio | Fatigue fracture rate (%) | Number of sheets exhibiting defective images (million) |
|---|---|---|---|---|---|---|
| Example 4 | 2 | (3) | 0.5 | 0.16 | 0 | 105 |
| Example 5 | 2 | (1) | 0.3 | 0.16 | 0 | 150 |
| Example 6 | 2 | (2) | 0.1 | 0.25 | 0 | 170 |
| Example 7 | 2 | (3) | 0.5 | 0.33 | 0 | 150 |

In the presensitized plates of the present invention (Examples 4–7), since minute concave pits each falling within a predetermined range with respect to the average opening diameter of the pits as well as the average ratio of pit depth/pit opening diameter are formed on the surface of aluminum plate, the surface area of the aluminum plate is increased, thereby improving the adhesive force of the aluminum plate to a recording layer (image area). As a result, the peeling of the image area or a partial missing of the image area can be prevented when the aluminum plate is formed into a presensitized plate, thus indicating an extremely excellent press life. The presensitized plate according to the present invention was found free from fatigue fracture during the printing when formed into a lithographic printing plate.

Since the presensitized plate of the present invention employs an aluminum plate having an aluminum purity of 99 wt % or more, which is represented by JIS A1000 type materials, it is possible to improve the efficiency and the stability of the roughening treatment. Additionally, since the fatigue fracture strength after the heat treatment at 300° C. for 7 minutes is 75% or more of that before the heat treatment, it is possible to prevent the generation of cracking during the printing even if the burning treatment which is usually performed at a temperature of 200° C. or more, in particular at a temperature ranging from 240° C. to 270° C. has been performed on the presensitized plate.

Further, since the surface of the aluminum plate is provided with the specific minute pits, the surface area of the aluminum plate can be increased, thereby improving the adhesive force of the aluminum plate to a recording layer (image area). As a result, the peeling of the image area or a partial missing of the image area can be prevented when the aluminum plate is formed into a presensitized plate, thus providing an extremely excellent press life.

What is claimed is:

1. A presensitized plate, comprising:

a support of a lithographic printing plate including concave pits having an average opening diameter of 20–300 nm and an average ratio of a depth of the concave pit to an opening diameter of the concave pit (pit depth/pit diameter) ranging from 0.15 to 1.0 formed by electrochemical roughening treatment in an aqueous solution of nitric acid and/or electrochemical roughening treatment in an aqueous solution of hydrochloric acid on the surface of an aluminum plate containing 0.15–0.5 wt % of Fe; 0.03–0.15 wt % of Si; 0.003–0.050 wt % of Ti, 0.002–0.015 wt % of Cu and 0.001–0.1 wt % of Mg and having an aluminum purity of not less than 99 wt %; and a photosensitive layer formed on the surface of said aluminum plate, wherein a fatigue fracture strength of the presensitized plate after a heat treatment at 300° C. for 7 minutes is not less than 75% of the fatigue fracture strength thereof before the heat treatment.

2. The presensitized plate according to claim 1, wherein a 0.2% proof stress after a heat treatment at 300° C. for 7 minutes is not less than 65% of the 0.2% proof stress before the heat treatment.

3. The presensitized plate according to claim 1, wherein crystal grains of aluminum, located within a region ranging from the surface of said aluminum plate to a depth of 50 μm have an average width of not more than 80 μm and a maximum width of not more than 150 μm in a direction perpendicular to a rolling direction of said aluminum plate, and have an average length of not more than 400 μm and a maximum length of not more than 500 μm in a rolling direction of said aluminum plate.

4. The presensitized plate according to claim 1, wherein said support is processed by etching treatment in an alkaline aqueous solution after the electrochemical roughening treatment.

5. The presensitized plate according to claim 4, wherein the dissolved amount of aluminum plate is 0.1–4 g/m$^2$ in the etching treatment in an alkaline aqueous solution after the electrochemical roughening treatment.

6. The presensitized plate according to claim 4, wherein the dissolved amount of aluminum plate is 0.01–0.8 g/m$^2$ in the etching treatment in an alkaline aqueous solution after the second electrochemical roughening treatment.

* * * * *